United States Patent [19]
Sono et al.

[11] Patent Number: 5,343,615
[45] Date of Patent: Sep. 6, 1994

[54] SEMICONDUCTOR DEVICE AND A PROCESS FOR MAKING SAME HAVING IMPROVED LEADS

[75] Inventors: Michio Sono; Akihiro Kubota; Junichi Kasai; Masanori Yoshimoto, all of Kawasaki; Keiichi Masaki, Nagano, all of Japan

[73] Assignee: Fujitsu Limited, Kawasaki, Japan

[21] Appl. No.: 853,798

[22] Filed: Mar. 19, 1992

[30] Foreign Application Priority Data

Mar. 22, 1991 [JP] Japan .................. 3-059060

[51] Int. Cl.⁵ .................. H01R 43/00; B29B 13/00
[52] U.S. Cl. .................. 29/827; 264/271.1; 264/272.17
[58] Field of Search .................. 29/827; 257/666; 264/271.1, 272.17

[56] References Cited

U.S. PATENT DOCUMENTS 5,152,056  10/1992  Shook .................. 29/827

FOREIGN PATENT DOCUMENTS 0397320  11/1990  European Pat. Off. .
144048  7/1986  Japan .................. 257/666

OTHER PUBLICATIONS

Patent Abstracts of Japan, vol. 007 No. 194 (E-195) 24 Aug. 1983 & JP-A-58 095 851 (Matsushita Denshi Kogyo KK) 7 Jun. 1983 *abstract*.
Patent Abstracts of Japan, vol. 010, No. 145 (E-407) 28 May 1986 & JP-A-61 007 653 (Nippon Denki KK) 14 Jan. 1986 *abstract*.

*Primary Examiner*—P. W. Echols
*Attorney, Agent, or Firm*—Staas & Halsey

[57] ABSTRACT

A process for producing a semiconductor device having a package with a semiconductor element molded therein, and a plurality of leads, each constituted by an inner lead located inside the package and an outer lead located outside the package, the leads being arranged in a line at a predetermined pitch, and the semiconductor element being electrically connected to the inner lead of each of the leads, wherein each side edge of each of the outer leads is flat.

5 Claims, 9 Drawing Sheets

SEMICONDUCTOR DEVICE AND A PROCESS FOR MAKING SAME HAVING IMPROVED LEADS

BACKGROUND OF THE INVENTION (1) Field of the Invention

The present invention relates to a semiconductor device, a process for producing the semiconductor device and a lead frame used in the process for producing the semiconductor device.

(2) Description of Related Art

A general process for producing a semiconductor device includes a die bonding process in which a semiconductor element is bonded on a stage part of a lead frame, a wire bonding process in which each electrode of the semiconductor element is connected to one of the leads of the lead frame by a wire, and an encapsulation process in which the semiconductor is encapsulated by a resin package or a ceramic package. The encapsulation process is carried out after the wire bonding process. Recently, there has been a tendency to increase the number of leads provided in a lead frame and accordingly an increase in the density in the leads of the semiconductor device. Thus, the pitch between adjacent leads becomes small. It is desired that a semiconductor device having a lead frame in which the pitch between adjacent leads is small be produced in high volume.

Figure 1:
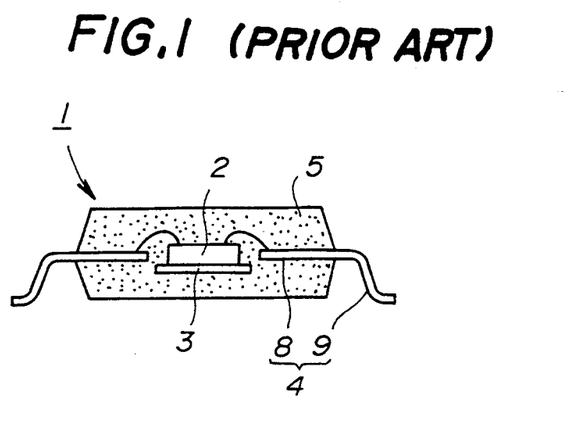
FIG. 1 is a cross sectional view illustrating a conventional semiconductor device.

FIG. 1 is a cross sectional view showing a conventional semiconductor device referred to as a SOP (Small Outline Package) type. In the semiconductor device 1 shown in FIG. 1, a semiconductor element 2 is bonded on a stage part 3 of a lead frame, and each electrode of the semiconductor element 2 is connected to one of leads 4 by a wire (formed, for example, of Au), in a wire bonding process. The semiconductor element 2 and a part of each of leads 4 are encapsulated by a resin package 5. The part of the each of leads 4 located inside the resin package 5 is referred to as an inner lead 8. A part of each of the leads 4 located outside the resin package 5 is referred to as an outer lead 9. The wire is bonded to an end of the inner lead 8, and the outer lead 9 is electrically connected to an external circuit. In the production process of the semiconductor device, at least until the encapsulation process is finished, the stage part 3 and the leads 4 are integrated, as a lead frame, with each other.

Figure 2:
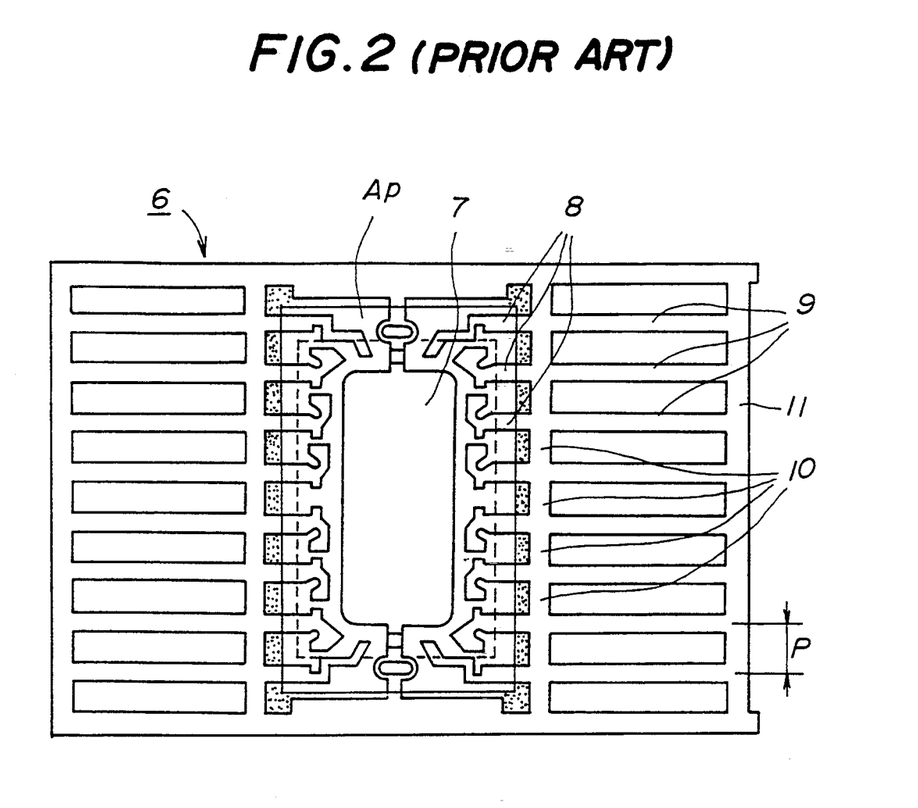
FIG. 2 is a plan view illustrating a conventional lead frame.
Figure 3:
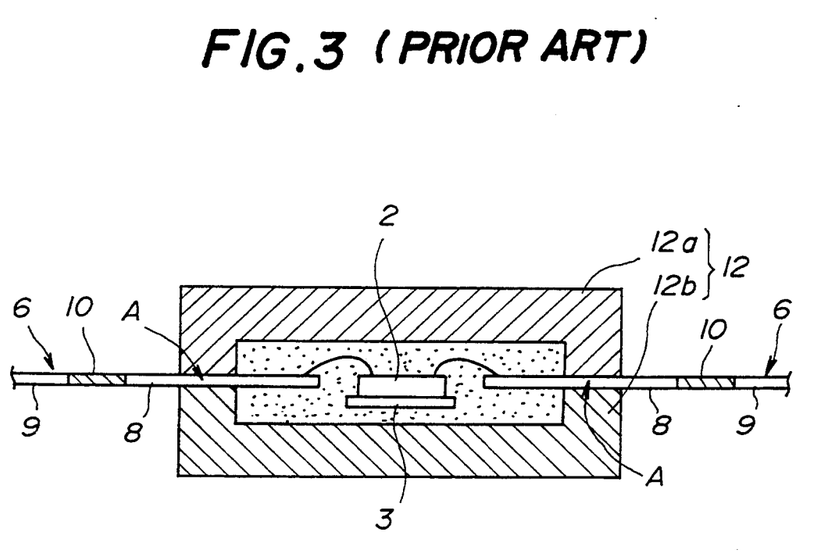
FIG. 3 is a cross sectional view illustrating a conventional semiconductor device set in dies.

FIG. 2 shows a conventional lead frame. A lead frame 6, shown in FIG. 2, is constituted by a stage part 7, leads each having an inner lead 8 and an outer lead 9, tie-bars 10 each connecting each pair of adjacent leads and a cradle 11 connecting ends of the outer leads 9. The leads are prevented, by the tie-bars 10 and the cradle 11, from separating from each other. The tie-bars 10 are used as location bars for maintaining a pitch of adjacent leads at a predetermined value P in the production process of the semiconductor device. The tie-bars 10 also function to prevent resin from leaking toward the outer lead 9 when a resin molding is performed in the encapsulation process. In FIG. 2, the resin package 5 is located on an area $A_p$. In the encapsulation process, the lead frame 6, obtained after the die bonding and wire bonding processes, is set in a die 12 (constituted by an upper die 12a and a lower die 12b) as shown in FIG. 3. When the lead frame 6 is set in the die 12, a small space A is formed between the upper die 12a and the lower die 12b in a region between adjacent inner leads 8. In this condition, when the resin molding is carried out in the dies 12, the resin is leaked from the dies 12 via the small space. However, the leaked resin is trapped in a space surrounded by each tie-bar 10 and each pair of adjacent inner leads 8.

Figure 4:
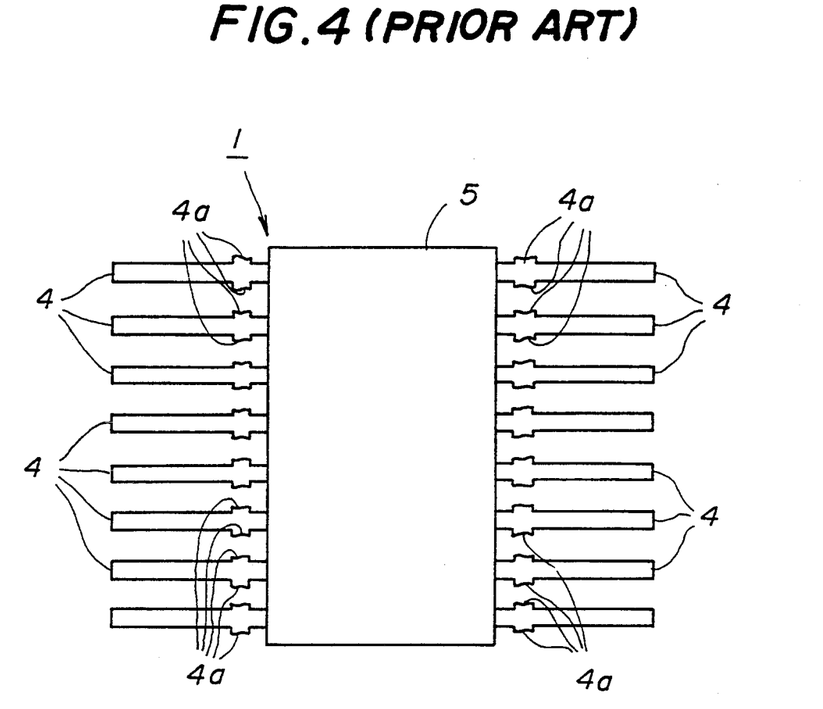
FIG. 4 is a plan view illustrating a conventional semiconductor device in which the tie-bars and the cradle of the lead frame are cut off.

After the encapsulation process is finished, the tie-bars 10 and the cradle 11 are cut off so that the leads 4 project from both sides of the resin package 5, as shown in FIG. 4. After this, the leads 4 are bent and dipped in solder, so that the semiconductor device 1 is shaped as shown in FIG. 1.

Due to cutting of the tie-bars 10, a cutting part 4a having a new shear plane exists on each side of each of the leads 4. As the lead frame 6 is strained by heat supplied in the resin molding process (the encapsulation process), it is hard to accurately cut off the tie-bars so that a surface (the new shear plane) of the cutting part 4a and the side surface (an original shear plane) of each of the leads 4 are uniformly continued. Thus, in the conventional semiconductor device, the cutting part 4a projects from the side surface of each of the leads 4, as shown in FIG. 4. In a case where the integration density of the leads of the semiconductor device is increased, the number of leads 4 projecting from the resin package 5 is increased. Thus, the projection of the cutting part 4a of each of the tie-bars 10 prevents the integration density of the leads of the semiconductor device from being increased. In addition, the leads 4 are bent so as to have a predetermined shape. However, where a cutting part 4a projects from each lead 4, stiffness of each lead 4 is non-uniform. As a result, each lead 4 is difficult to bend in a predetermined shape, so that there are cases where adjacent leads 4 can not be in contact with each other and where the lead is not connected to the external circuit. On the other hand, when the length of each tie-bar 10 to be cut off is lengthened to prevent a cutting part 4a from projecting from each side of each lead, a case where the width of the lead at the cutting part 4a is less than the with of the lead at a part having no cutting part 4a can occur. In this case, as the width of the lead at the cutting part 4a is smaller the strength of the each of leads 4 is decreased.

SUMMARY OF THE INVENTION

Accordingly, a general object of the invention is to provide a novel and useful semiconductor device, a process of producing the semiconductor device and a lead frame used in the process of producing the semiconductor device, in which the disadvantages of the aforementioned prior art are eliminated.

A more specific object of the present invention is to provide a semiconductor device in which the density of the leads thereon can be increased.

Another object of the present invention is to provide a semiconductor device in which each of leads can be easily bent in a predetermined shape.

The above objects of the present invention are achieved by a semiconductor device comprising: a package with a semiconductor element molded therein; and a plurality of leads, each constituted by an inner lead located inside said package and an outer lead located outside said package, said leads being arranged in a line at a predetermined pitch, and the semiconductor element being electrically connected to said inner lead of each of said leads, and wherein each side of said outer lead is flat.

A further object of the present invention is to provide a process for producing the semiconductor device.

This object of the present invention is achieved by a process for producing a semiconductor device having a package with a semiconductor element molded therein, and a plurality of leads, each constituted by an inner lead located inside said package and an outer lead located outside said package, said leads being arranged in a line at a predetermined pitch, the semiconductor element being electrically connected to said inner lead of each of said leads, and each side edge of said outer lead being flat, said process comprising the steps of: (a) having a lead frame, said lead frame comprising: a frame body having a space formed therein; a stage part projecting from an inner edge, facing the space, of said frame body; a plurality of inner leads projecting from the inner edge, facing the space, of said frame body so as to surround said stage part; a plurality of outer leads formed on said frame body, a first end of each of said plurality of outer leads being continuously connected to one of said plurality of inner leads, each of said plurality of outer leads extending in a direction in which a corresponding one of said inner leads extends, and a second end of each of said plurality of outer leads being integrated with said frame body; a plurality of fragments formed on said frame body, each of said plurality of fragments being located between adjacent outer leads and separated therefrom by straight slits, a first end of each of said plurality of fragments reaching the inner edge, facing the space, of said frame body, and a second end of each of said plurality of fragments being integrated with said frame body; (b) bonding the semiconductor element on said stage part of said lead frame; (c) electrically connecting the semiconductor element to each of said plurality of inner leads of said lead frame; (d) encapsulating said semiconductor element so that said semiconductor element, said stage part, and said plurality of inner leads are located in a package; and (e) cutting said lead frame in a direction crossing said plurality of said outer leads and said plurality of fragments, so that said plurality of fragments are removed from said package.

A further object of the present invention is to provide a lead frame used in the above process of producing a semiconductor device.

This object of the present invention is achieved by a lead frame used in a process of producing a semiconductor device having a package with a an semiconductor element molded therein, and a plurality of leads, each constituted by an inner lead located inside said package and an outer lead located outside said package, said leads being arranged in a line at a predetermined pitch, the semiconductor element being electrically connected to said inner lead of each of said leads, and each side edge of said outer lead being flat, said lead frame comprising: a frame body having a space formed therein; a stage part projecting from an inner edge, facing the space, of said frame body; a plurality of inner leads projecting from the inner edge, facing the space, of said frame body so as to surround said stage part; a plurality of outer leads formed on said frame body, a first end of each of said plurality of outer leads being continuously connected to one of said plurality of inner leads, each of said plurality of outer leads extending in a direction in which a corresponding one of said inner leads extends, and a second end of each of said plurality of outer leads being integrated with said frame body; a plurality of fragments formed on said frame body, each of said plurality of fragments being located between adjacent outer leads and separated therefrom by straight slits, a first end of each of said plurality of fragments reaching the inner edge, facing the space, of said frame body, and a second end of each of said plurality of fragments being integrated with said frame body.

According to the present invention, as each side of each of the outer leads is flat, the pitch of adjacent outer leads can be decreased. Thus, the density of the leads of the semiconductor device can be increased. In addition, the outer leads can be smoothly bent in a predetermined shape.

Additional objects, features and advantages of the present invention will become apparent from the following detailed description when read in conjunction with the accompanying drawings.

DESCRIPTION OF THE PREFERRED EMBODIMENTS

A description will now be given of a semiconductor device according to an embodiment of the present invention with reference to FIGS. 5 and 6.

Figure 5:
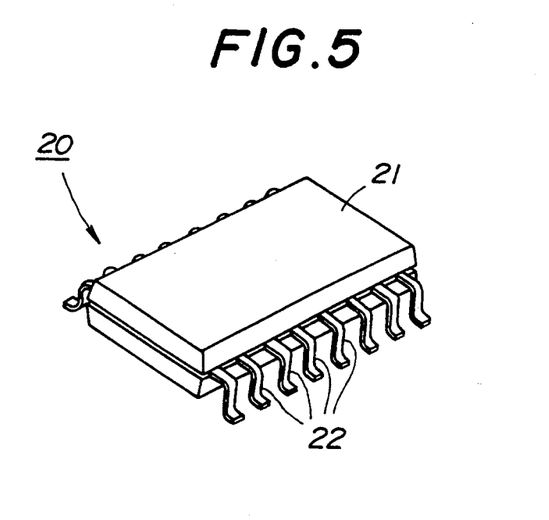
FIG. 5 is a perspective view illustrating a semiconductor device according to an embodiment of the present invention.
Figure 6:
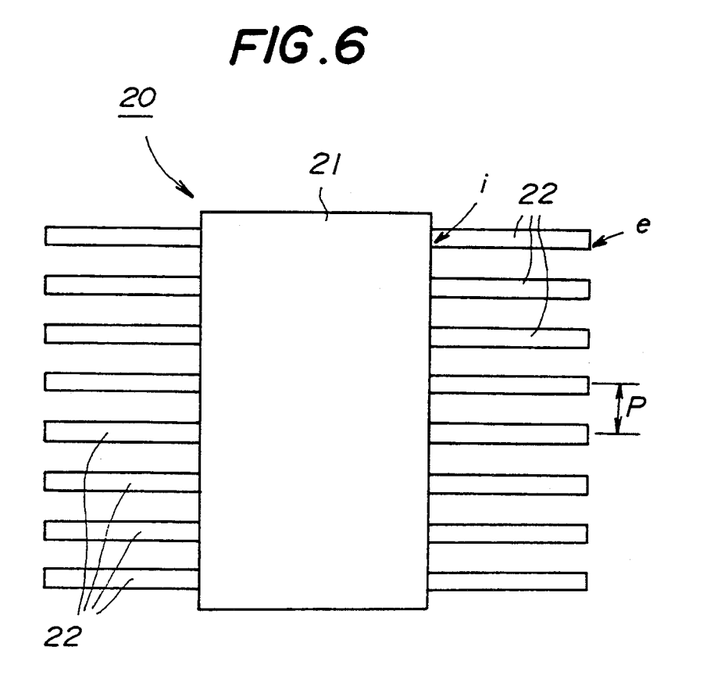
FIG. 6 is a plan view illustrating the semiconductor device the before leads are bent in a predetermined shape.

FIG. 5 is a perspective view illustrating a semiconductor device, and FIG. 6 is a plan view illustrating the semiconductor device in a state before the leads are bent. Referring to FIGS. 5 and 6, a semiconductor device 20 has a package 21 and a plurality of leads 22, projecting from each side surface of the package 21. The package 21 is formed, for example, of epoxy resin. Each side of each of the leads 22 is flat between an end (e) of each of the leads 22 and a point (i) at which each of the leads 22 enters into the package 21. That is, each of the leads 22 has no cutting part 4a such as that shown in FIG. 4. Thus, the number of leads can be increased, so that it is possible to obtain a semiconductor device in which the density of the leads is increased. Even if the pitch P of each pair of adjacent leads 22 is decreased to increase the density of the leads, the adjacent leads 21 are not in contact with each other. Further, the leads 22 can be smoothly bent in a predetermined shape as shown in FIG. 5.

A description will now be given of a process of producing the semiconductor device having the appearance shown in FIGS. 5 and 6.

Figure 8:
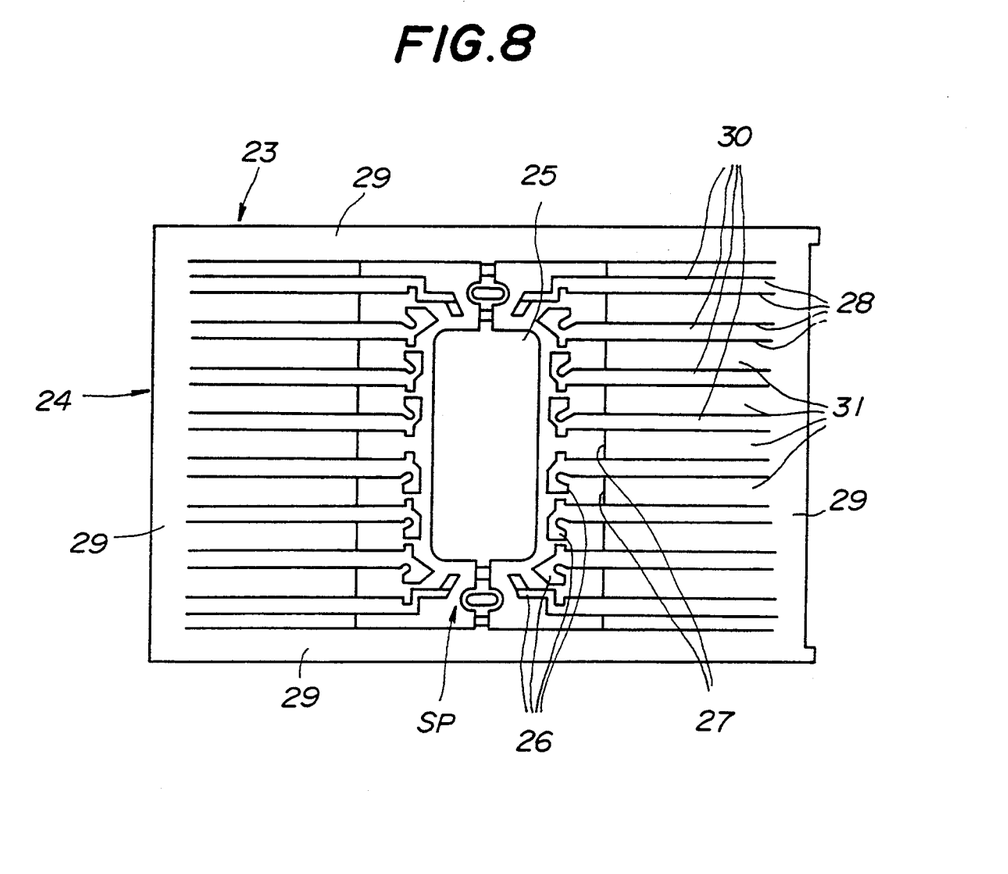
FIG. 8 is a plan view illustrating a lead frame according to an embodiment of the present invention.

In this production process of the semiconductor device, a lead frame 23 shown in FIG. 8 is used. The lead frame 23 shown in FIG. 8 is made as follows.

Figure 7:
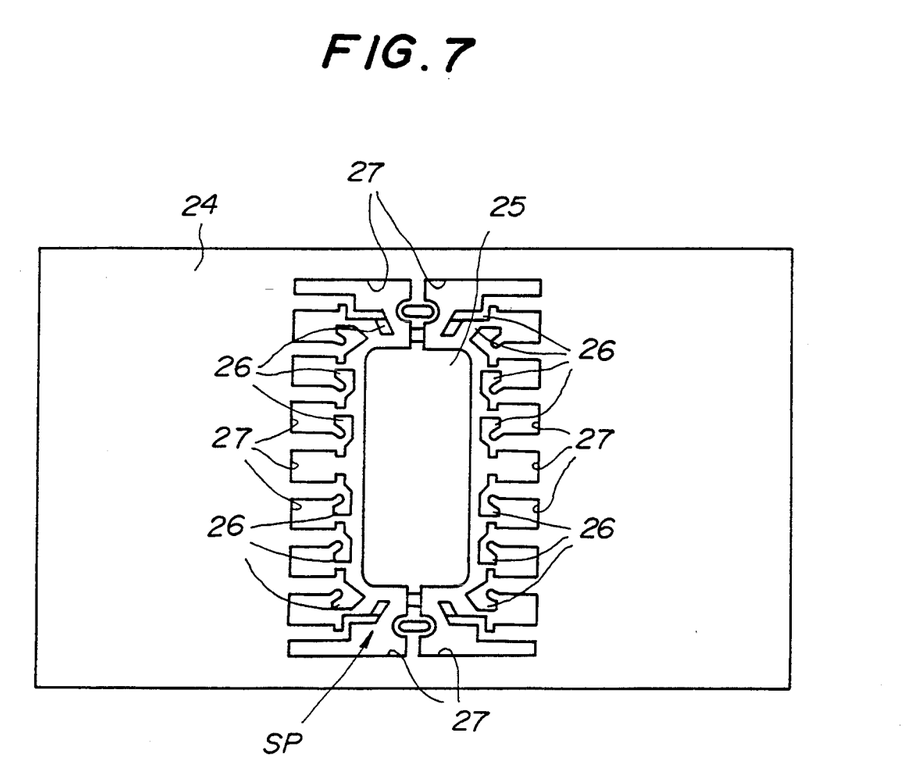
FIG. 7 is a plan view illustrating a base plate used for making a lead frame.

In a first stamping process, a base plate 24 is stamped out so as to have a shape shown in FIG. 7. The base plate 24 is formed of ferro-alloy such as 42-alloy, copper alloy such as MF-202, EFTEC-64, or the like. The base plate 24 is a metallic plate or metallic foil having a thickness falling within a rage of 0.05 mm–0.25 mm. The metallic plate and the metallic foil formed of the above material and having the above thickness are generally used as the base plate for the lead frame.

Due to the stamping of the base plate 24 in the first stamping process, a space (SP) is formed on the base plate 24 so that a stage part 25 and a plurality of inner leads 26 remain in the base plate 24 in a state where the stage part 25 and the inner leads 26 project from an edge 27, of the base plate 24, facing the space (SP). The stage part 25 is located in the center of the base plate 24, and the inner leads 26 surround the stage part 25.

In a second stamping process, the base plate 24 is further stamped so that a lead frame 23 shown in FIG. 8 is obtained. Due to the stamping of the base plate 24 in the second stamping process, slits 28 corresponding to edges of the inner leads 26 are formed in the base plate 24. Each of slits 28 is continued from a point at which a corresponding one of the edge: of each of the inner leads 26 is joined to the edge 27 facing the space (SP) formed in the first stamping process, in a direction in which the corresponding one of the edges of each of the inner leads 26 extends. Each of the slits 28 has a predetermined length less than a length between the edge 27 facing the space (SP) and an outer edge of the base plate 24, so that cradles 29 are formed at a periphery of the base plate 24. A outer lead 30 is formed between adjacent slits 28 corresponding to two edges of each of the inner leads 26 so as to continuously extend from each of the inner leads 26. In addition, a fragment 31 is formed between adjacent slits 28 corresponding to edges, of adjacent inner leads 26, facing each other. That is, outer leads 30 and fragments 31 are alternatively arranged.

Due to the above first and second stamping process, the lead frame 23 shown in FIG. 8 is made.

The lead frame 23 is supplied to the production process of the semiconductor device, and a semiconductor element 32 is then bonded on the stage part 25 of the lead frame 23 (in the die bonding process). After this, each of electrodes formed on the surface of the semiconductor element 32 is electrically connected to a corresponding one of the inner leads 26 by an Au wire (in the wire bonding process).

Figure 9:
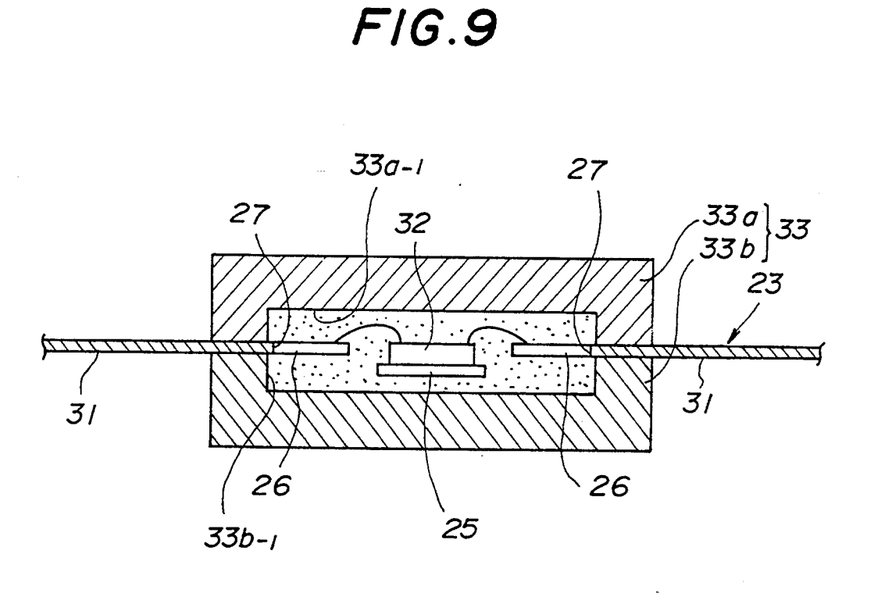
FIG. 9 is a cross sectional view illustrating the semiconductor device set in resin molding dies.

After the above die bonding and wire bonding processes, the lead frame 23 is set in a resin molding die 33 (constituted by an upper die 33a and a lower die 33b), as shown in FIG. 9. That is, the lead frame 23 is set in the resin molding die 33 so that the edge 27 of each fragment 31 facing the space (SP) of the lead frame 23 is located close to a border between the inside of a cavity of the resin molding die 33 and the outside of the cavity thereof. The cavity has a shape corresponding to the package 21 and is constituted by an upper cavity 33a-1 formed on the upper die 33a and a lower cavity 33b-1 formed on the lower die 33b. It is preferable that the edge 27 be located inside the cavity of the resin molding die 33. After the lead frame 23 is set in the resin molding die 33, the cavity is filled with resin under a condition in which the resin molding die 33 is maintained at a predetermined cure temperature for a predetermined cure time. When the cure time elapses, the upper die 33a and the lower die 33b are separated from each other, and the lead frame 23 provided with the resin package 21 is taken out form the resin molding die 33.

Figure 10:
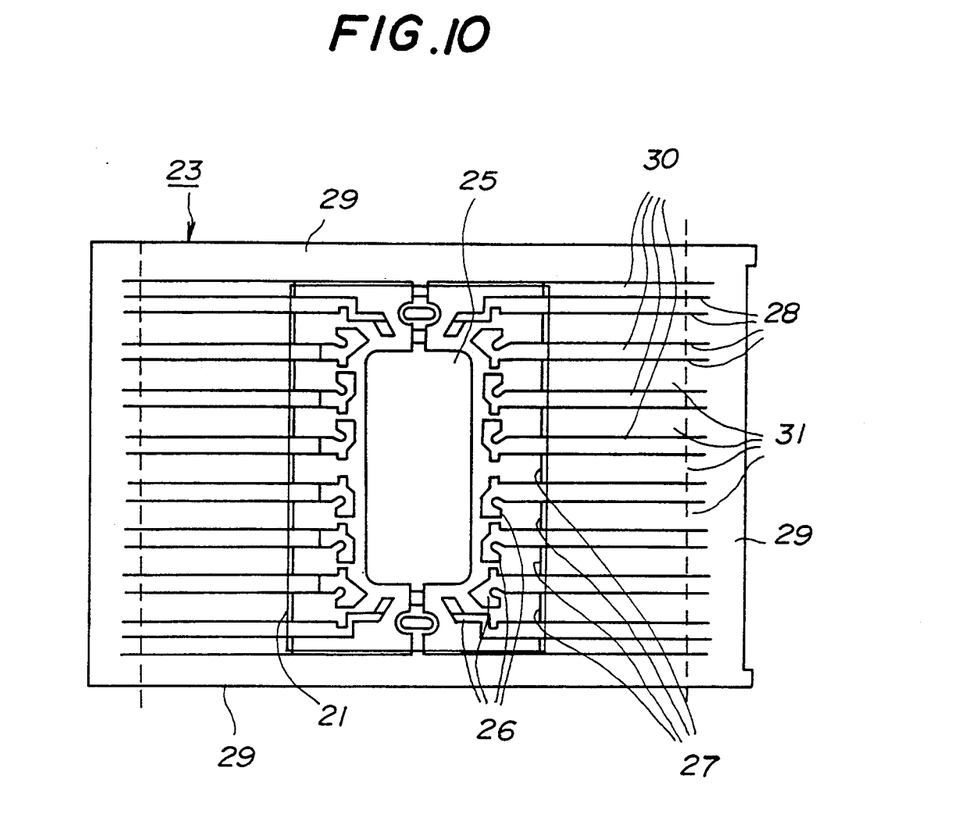
FIG. 10 is a plan view illustrating the lead frame on which a resin package is molded.

The resin package 21 is located on the lead frame 23, as show in FIG. 10. The outer side surface of the resin package 21 is located in an area within a range of ±0.3 mm with respect to the edge 27 of each fragment 31 facing the space (SP) of the lead frame 23. It is preferable that the edge 27 of each fragment 31 be located in the resin package 21.

In a case where the lead frame 23 is set in the resin molding die 33 so that a locating relationship between the edge 27 and the cavity of the resin molding die 33 is maintained as described above, the small space between the upper die 33a and the low die 33 is filled or at least blocked by the inner end of each fragment 31. Thus, in the resin molding process, little, if any, resin leaks from the resin molding die 33, so that the amount of burr adhered to each of the outer leads 30 on an area close to the resin package 21 is less than the amount of that adhered to a conventional lead frame shown in FIG. 2. As a result, a process for removing the burr from the lead frame 23 can be omitted from the production process of the semiconductor device.

Figure 11:
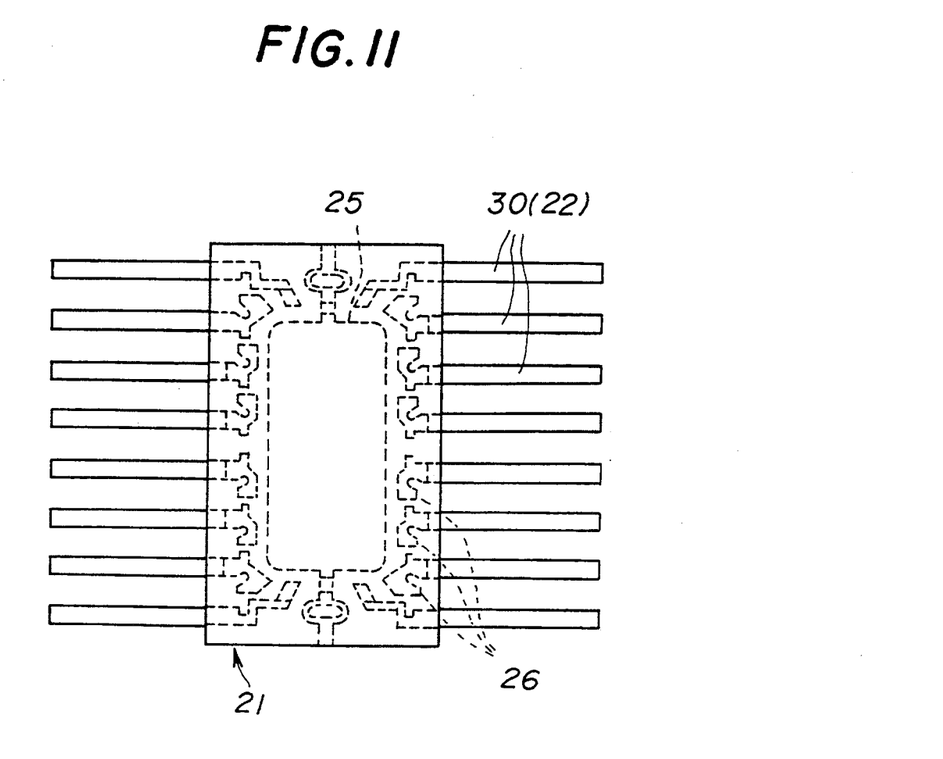
FIG. 11 is a plan view illustrating the semiconductor device according to the embodiment before outer leads are bent.

After the resin package 12 is molded on the lead frame 23, the lead frame 23 is stamped at a position shown by dotted lines in FIG. 10. As a result, the cradles 29 and the fragments 31 are removed from the lead frame, so that the outer leads 30 projecting from the resin package 21 are separated from each other, as shown in FIG. 11. The edge 27 of each of the fragments 31 is located in the resin package 21. However, as the part of each of the fragments 31 located in the resin package 21 is slight (0.3 mm at the most), the fragments 31 can be easily removed from the resin package 21.

After the lead frame 23 is stamped, the outer leads 30 are bent in a predetermined shape as shown in FIG. 5. Then the outer leads 30 are dipped in solder so that the solder is adhered to the surface of each of the outer leads 30.

According to the above embodiment, as the lead frame in which the outer leads 30 and the fragments 31 are alternatively arranged is used in the production process of the semiconductor device, there is no projection on the sides of the outer leads 30 such as the productions 4a of the prior art shown in FIG. 4. Thus, adjacent outer leads 30 are not in contact with each other, and each outer lead 30 can be smoothly bent in a predetermined shape.

In the process for making the lead frame 23, each side edge of each of the outer leads 30 which should project from the package 21 is formed by one stamping process. That is, each side edge of each of the outer leads 30 has one shear plane. Thus, when the outer leads 30 are dipped in solder, the solder can be uniformly adhered to the outer leads 30. On the other hand, in the conventional semiconductor device having leads projecting from the package, each side of each of the leads 4 has at least two shear planes. That is, the first shear plane is formed on the cutting part 4a of each of the tie-bars 10 and the second shear plane is formed on a part having no tie-bar 10. Degrees of solder adhesion to different shear planes differ from each other. Thus, in a process for dipping the leads in solder, it is hard to uniformly adhere solder to each of leads. If solder is ununiformly adhered to each of the lead, stable electrical characteristics of the semiconductor device can not be obtained.

In the above embodiment, the slits 28 are formed by a stamping process. However, the slits 28 can be formed by using an etching or other suitable process.

The present invention is not limited to the aforementioned embodiments, and variations and modifications may be made without departing from the scope of the claimed invention.

What is claimed is:

1. A process for producing a semiconductor device having a package with a semiconductor element molded therein, and a plurality of leads, each lead being constituted by an inner lead located inside said package and an outer lead located outside said package, said leads being arranged in a line at a predetermined pitch, the semiconductor element being electrically connected to said inner lead of each of said leads, and each side edge of said outer lead being flat, said process comprising the steps of:

(a) providing a lead frame,
said lead frame comprising:
a frame body having a space formed therein, said space having an inner edge;
a stage part projecting inwardly from the inner edge of the space;
a plurality of inner leads projecting inwardly from the inner edge of the space so as to surround said stage part;
a plurality of outer leads formed on said frame body, a first end of each of said plurality of outer leads being continuously connected to one of said plurality of inner leads, each of said plurality of outer leads having a first end extending inwardly in a direction in which a corresponding one of said inner leads extends, and a second end which is integral with said frame body;
a plurality of fragments formed on said frame body, each of said plurality of fragments being located between adjacent outer leads and separated therefrom by straight slits which form flat side edges on each of said outer leads, a first end of each of said plurality of fragments reaching the inner edge of the space of said frame body, and a second end of each of said plurality of fragments being integral with said frame body;

(b) bonding the semiconductor element on said stage part of said lead frame;

(c) electrically connecting the semiconductor element to each of said plurality of inner leads of said lead frame;

(d) encapsulating said semiconductor element so that said semiconductor element, said stage part, and said plurality of inner leads are located in a package; said package being formed so that an outer surface of said package is located in an area within a range of ±0.3 mm with respect to the first end of each of said plurality of fragments; and (e) cutting said lead frame in a direction crossing said plurality of said outer leads and said plurality of fragments, so that said plurality of fragments are removed from said package.

2. A process as claimed in claim 1, wherein in said step (d) said encapsulating is accomplished by molding a resin to form said package.

3. A process as claimed in claim 1, wherein said step (3) includes stamping said lead frame in a direction crossing said plurality of outer leads and said plurality of fragments.

4. A process as claimed in claim 1, wherein the second end of each of said plurality of said outer leads and the second end of each of said plurality of said fragments extend to a position adjacent an edge of said lead frame.

5. A process as claimed in claim 1, wherein said package is formed in step (d) so that the first end of each of said plurality of fragments is located inside said package.

* * * * *

UNITED STATES PATENT AND TRADEMARK OFFICE
CERTIFICATE OF CORRECTION

PATENT NO. : 5,343,615
DATED : September 6, 1994
INVENTOR(S) : Michio SONO et al.

It is certified that error appears in the above-indentified patent and that said Letters Patent is hereby corrected as shown below:

Title Page, [73] Assignee: please change to

--Fujitsu Limited, Kawasaki, Japan

Shinko Electric Industries Co., Ltd.,

Nagano-shi, Nagano, 380 Japan--.

Signed and Sealed this

Thirteenth Day of June, 1995

Attest:

BRUCE LEHMAN

Attesting Officer

Commissioner of Patents and Trademarks